US010763833B2

(12) United States Patent
Muellner et al.

(10) Patent No.: US 10,763,833 B2
(45) Date of Patent: Sep. 1, 2020

(54) MULTIPHASE OSCILLATOR CIRCUIT

(71) Applicant: TEXAS INSTRUMENTS INCORPORATED, Dallas, TX (US)

(72) Inventors: Ernst Gerog Muellner, Munich (DE); Tobias Fritz, Mainburg (DE); Bradley Kramer, Kaufman, TX (US); Swaminathan Sankaran, Allen, TX (US); Baher Haroun, Allen, TX (US); Ralf Brederlow, Poing (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/235,291

(22) Filed: Dec. 28, 2018

(65) Prior Publication Data

US 2020/0212895 A1 Jul. 2, 2020

(51) Int. Cl.
*H03K 3/03* (2006.01)
*H03K 3/014* (2006.01)

(52) U.S. Cl.
CPC .......... *H03K 3/0315* (2013.01); *H03K 3/014* (2013.01)

(58) Field of Classification Search
CPC ..... H03K 3/014; H03K 3/0315; H03K 3/0322
USPC ......................................................... 331/57
See application file for complete search history.

(56) References Cited

U.S. PATENT DOCUMENTS

| | | | | |
|---|---|---|---|---|
| 5,592,127 A * | 1/1997 | Mizuno | ................ | H03K 3/0315 331/172 |
| 6,040,743 A * | 3/2000 | Bjorklid | ................ | H03L 7/099 327/270 |
| 6,188,291 B1 * | 2/2001 | Gopinathan | ........... | H03B 27/00 331/172 |
| 7,449,961 B2 * | 11/2008 | Sai | ......... | H03L 7/0995 331/2 |
| 7,705,687 B1 * | 4/2010 | Paz | ....... | H03K 3/0315 327/161 |
| 10,003,326 B1 * | 6/2018 | Lee | ....... | H03K 3/0315 |
| 2006/0001496 A1 * | 1/2006 | Abrosimov | .......... | H03K 3/0322 331/57 |
| 2007/0018737 A1 * | 1/2007 | Drake | .................... | H03K 3/012 331/57 |
| 2008/0252386 A1 * | 10/2008 | Kim | ...................... | H03K 3/0322 331/57 |
| 2009/0104885 A1 * | 4/2009 | Asayama | ................. | H03D 7/00 455/296 |
| 2009/0251225 A1 * | 10/2009 | Chen | ........................ | H03K 3/03 331/1 A |
| 2011/0053548 A1 * | 3/2011 | Kondou | ............... | H03K 3/0315 455/334 |

(Continued)

*Primary Examiner* — Levi Gannon
(74) *Attorney, Agent, or Firm* — Michael A. Davis, Jr.; Charles A. Brill; Frank D. Cimino (57) ABSTRACT

In described examples, a ring oscillator includes a series of N stages in a first ring. Each stage includes a respective output terminal coupled to a respective input terminal of a next one of the stages in the first ring. N is a positive odd-numbered integer of at least three. A series of N level shifters in a second ring are respectively connected to the N stages. Each level shifter receives a respective clock output from a respective output terminal of a stage to which it is connected and generates a respective boosted clock output in response thereto. The boosted clock output is coupled to control an impedance state of a next one of the level shifters in the second ring.

19 Claims, 6 Drawing Sheets

(56) References Cited

U.S. PATENT DOCUMENTS

2014/0197895 A1\* 7/2014 Chen .................. G01R 31/2882
331/57

\* cited by examiner

MULTIPHASE OSCILLATOR CIRCUIT

TECHNICAL FIELD

This relates generally to electrical circuits, and more particularly to a multiphase oscillator circuit.

BACKGROUND

Low power duty cycled systems often employ oscillators that reach the target output frequency within a short time period, where data transmission in these systems relies on fast clock recovery. In serial communication of digital data, clock recovery is the process of extracting timing information from a serial data stream to allow the receiving circuit to decode the transmitted symbols in the data stream. Clock recovery from the data stream is expedited by modifying the transmitted data. If a serial communication channel does not transmit the clock signal along with the data stream, then the clock must be regenerated at the receiver, using timing information from the data stream. Clock recovery is a common component of systems communicating over wires, optical fibers, or by radio.

SUMMARY

In a described example, a ring oscillator includes a series of N stages in a first ring. Each stage includes a respective output terminal coupled to a respective input terminal of a next one of the stages in the first ring. N is a positive odd-numbered integer of at least three. A series of N level shifters in a second ring are respectively connected to the N stages. Each level shifter receives a respective clock output from a respective output terminal of a stage to which it is connected and generates a respective boosted clock output in response thereto. The boosted clock output is coupled to control an impedance state of a next one of the level shifters in the second ring.

In another described example, a circuit includes a ring oscillator including a series of stages. A first level shifter is coupled to receive an output of one of the stages. The first level shifter includes first, second and third transistors having respective first, second and third gates. The first transistor is coupled between a voltage reference and the second transistor. The second transistor is coupled between the first and third transistors. The third transistor is coupled between the second transistor and a voltage supply. At the first gate, the first level shifter is coupled to receive the output. At a node between the second and third transistors, the first level shifter is coupled to generate a boosted output in response to the received output. The second and third gates are coupled to receive a boosted output from a second level shifter for controlling an impedance state of the first level shifter.

In yet another described example, a method includes generating respective clock signals from a series of N stages in a ring oscillator, wherein N is a positive odd-numbered integer of at least three. In response to the clock signals, the method includes generating respective boosted clock signals from a series of N level shifters, which are connected in a ring. In response to each level shifter's respective boosted clock signal, the method includes controlling an impedance state of a next one of the level shifters in the ring.

DETAILED DESCRIPTION

Example embodiments relate to a multiphase oscillator circuit providing clock signals that are boosted by multiple level shifters. The circuit includes a ring oscillator that includes at least three stages in one example. But any number of odd numbered stages greater than or equal to three can be employed (e.g., 5, 7, 9, and so forth). Each of the ring oscillator stages includes an oscillator output terminal that provides a respective clock signal, which is coupled to an input terminal of another stage of the ring oscillator. Tight and accurate frequency control of the ring oscillator stages can be maintained at lower voltage levels, where voltage level shifters are provided to boost the lower voltage levels of respective clock signals from the ring oscillator stages to higher voltage levels, which can be subsequently used by downstream circuits (such as clock recovery serial data systems). Also, the generated and boosted clock signals described herein are useful for electronic fuses, load switches, power multiplexors, linear regulators, switching regulators, and so forth.

For Example, each level shifter is configurable to boost a voltage level of the clock signal from a respective oscillator output terminal of the respective stages, where the input voltage level (e.g., ring oscillator supply rail) supplying the respective oscillator stages is less than the voltage level (e.g., level shifter supply rail) supplying the level shifters. Current controls can be employed to control the frequency of the ring oscillator stages. In some examples, the system's power consumption can be mitigated because each level shifter stage (when boosting a respective clock signal) can place another level shifter stage in a high impedance state to conserve power in the system.

By providing at least three clock phases via the respective ring oscillator stages, three or more times oversampling can be performed at the given oscillator frequency. As a further example, the oscillator described herein includes a current-starved multi-stage ring oscillator with similarly configured oscillator stages (e.g., inverter, NOR or NAND gates). The frequency of the clock signals can be set by a controllable bias current supplied to the respective stages. For example, the use of NOR or NAND gates allows efficient disable/ enable control of the ring oscillator, which can be the same signal used to switch off the bias current. To achieve fast startup time of the ring oscillator, the operational voltage of the supply for the oscillator can be maintained (e.g., by a standby power circuit) while the oscillator is turned off via associated switching circuits.

In this description, the term "circuit" can include a collection of active and/or passive elements that perform an electronic circuit function, such as an analog circuit or control circuit. Additionally or alternatively, for example, the term "circuit" can include an integrated circuit (IC) in which all or some of the circuit elements are fabricated on a common substrate (e.g., semiconductor substrate, such as a die or chip).

Figure 1:
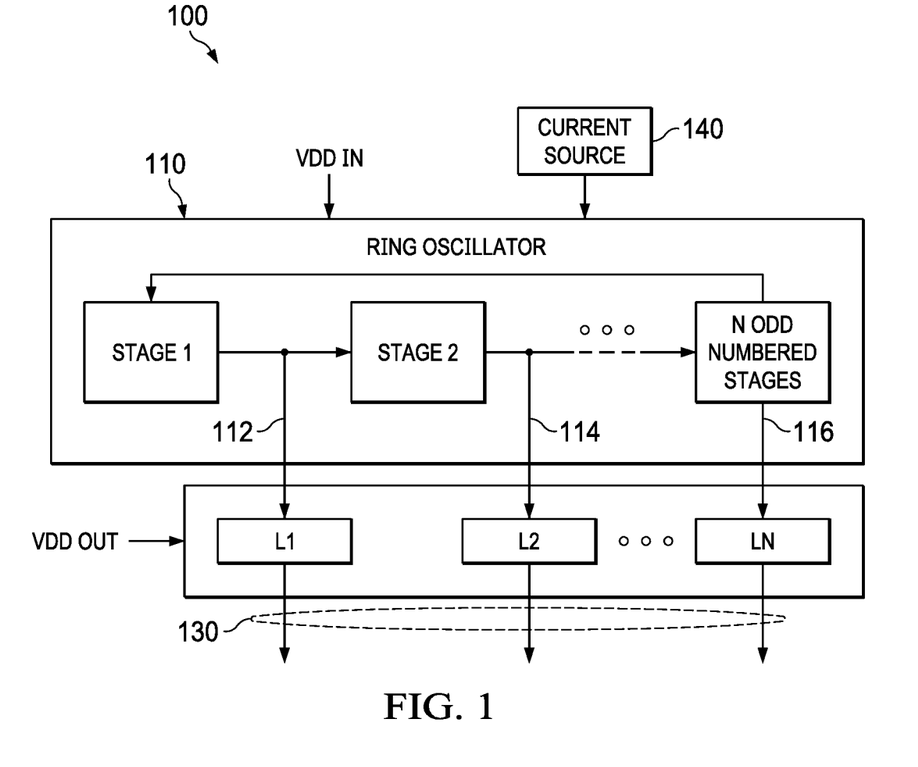
FIG. 1 is an example block diagram of a circuit in which a multistage ring oscillator generates clock signals that are boosted by multiple level shifters.

FIG. 1 illustrates an example of a circuit 100 in which a multistage ring oscillator 110 generates clock signals that are boosted by multiple level shifters. The ring oscillator 110 includes at least three stages, which are shown as stages 1, 2, up to N odd numbered of stages, where N is a positive odd-numbered integer. In this description, the term "ring oscillator" refers to a collection of inverting elements (such as logic inverters, NAND gates, NOR gates, and so forth) that are serially connected in a series of successive stages (e.g., serially connected in a chained ring), in which output from one oscillator stage drives a next oscillator stage, and the output of the last stage is fed back to the first stage. As described herein, the ring oscillator 110 has an odd number of at least three stages. Each of the stages includes an oscillator output terminal coupled to provide a respective clock signal 112, 114 and 116, which is coupled to another stage of the ring oscillator 110. The circuit 100 includes an output stage with at least three level shifters (one for each phase of the output), which are shown as level shifters L1 through LN.

In this description, the term "level shifter" refers to a circuit that: receives a signal (e.g., clock signal) that was generated from one supply voltage (e.g., a voltage supply rail or domain); and boosts the signal to a higher voltage level for consistency with another supply voltage (e.g., another voltage supply rail or domain). In this example, each level shifter L1 through LN is configured to: boost the voltage level of a respective one of the clock signals 112-116 (from a respective oscillator output terminal of the stages 1 through N); and output a respective one of the boosted clock output signals 130. Each level shifter's respective boosted clock output signal 130 is coupled to control switching states of a respective one of the other level shifters (e.g., switches the respective one of the other level shifters between a high impedance state and normal operating state).

Each stage of the ring oscillator 110 is coupled to receive an input supply voltage VDD IN, and each level shifter is coupled to receive an output supply voltage VDD OUT. The input voltage VDD IN is less than the output voltage VDD OUT, so the level shifters L1 through LN are configured to boost the voltage levels of the respective clock signals 112-116 (which are compatible with VDD IN) to the voltage levels of the boosted clock output signals 130 (which are compatible with VDD OUT).

In some examples, a controllable constant current source 140 generates an output current, which is supplied to each of the stages 1 through N. The clock signals 112-116 have frequencies, which are adjustable in response to a level of that output current. For example, by setting the current source 140 to generate a lower output current, each of the clock signals 112-116 has a corresponding lower frequency than would occur by setting the current source 140 to generate a higher output current.

The ring oscillator stages 1 through N may be implemented by inverters, NAND gates and/or NOR gates to generate the clock signals 112-116. A control input (such as enable signal 534 of FIG. 5) can be coupled to control at least one of the stages 1 through N to enable or disable the ring oscillator 110 circuit for a particular number of clock pulses. In another example, to achieve a desired startup frequency of the ring oscillator 110, one or more pulses of the clock signals 112-116 can be filtered in a beginning oscillator sequence (e.g., by attenuating or not generating one or more leading clock pulses).

Figure 5:
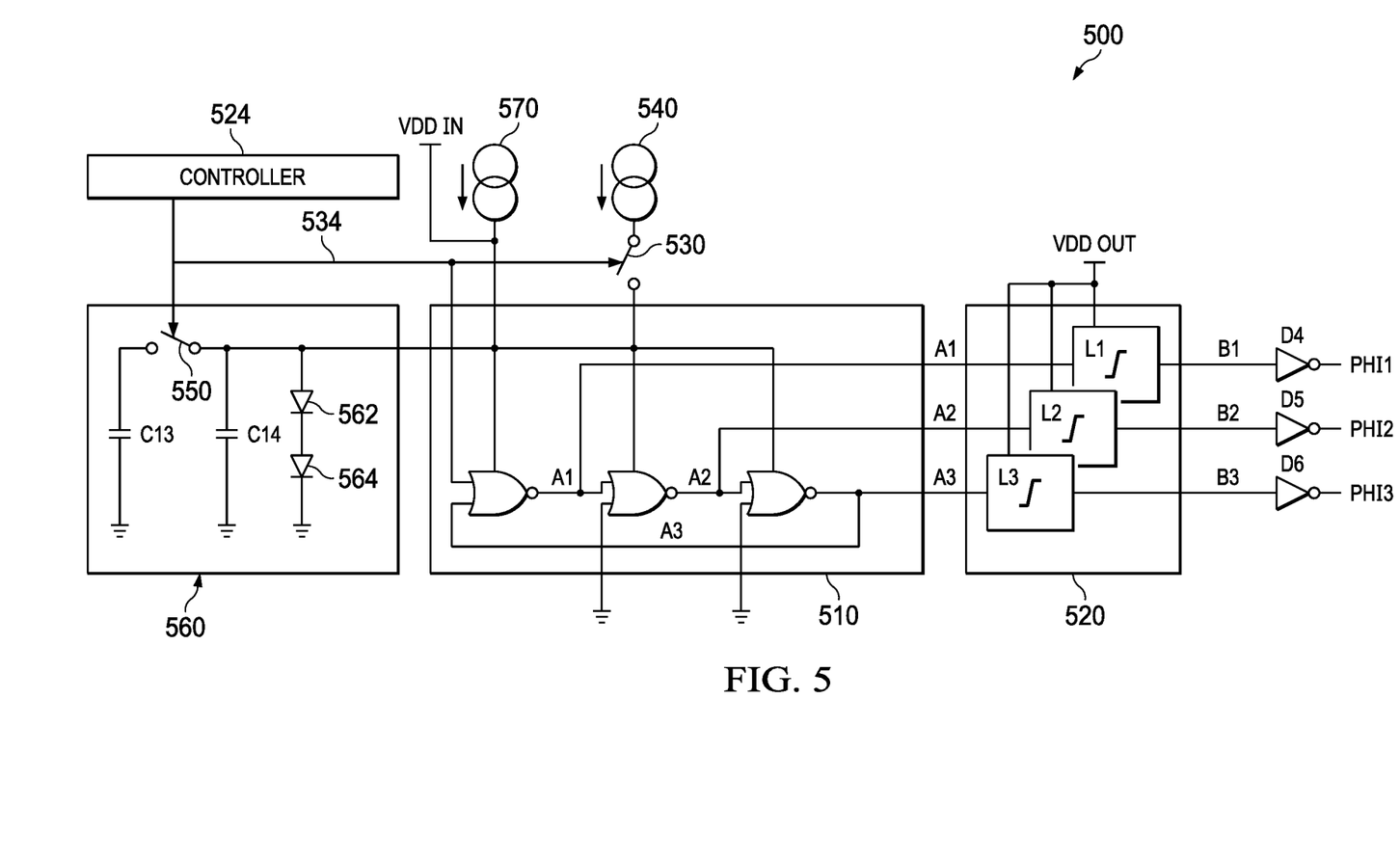
FIG. 5 illustrates an example implementation of ring oscillator and level shifter circuit that receives an enable signal to control oscillator startup.

In some examples, a pre-bias circuit (e.g., a capacitor and diode network or sample and hold network, such as diode capacitor network 560 of FIG. 5) can be coupled to VDD IN to prepare for startup of the ring oscillator 110. For example, the pre-bias circuit maintains VDD IN at or above a particular voltage threshold level while ring oscillator is controlled to be off.

Also, as described herein, the level shifters L1 through LN may be implemented as high-impedance (high-Z) level shifters, in which each level shifter's respective boosted clock output signal is coupled to control switching states in a respective one of the other level shifters (e.g., to place the respective one of the other level shifters in a high impedance state) to conserve power in the circuit 100. For example, at least one of the level shifters L1 through LN operates in its high-Z state during each clock cycle. In one example, the circuit 100 and/or other circuits illustrated and described below can be implemented as an integrated circuit on a substrate. In other examples, one or more portions of the circuit 100 can be implemented separately from a common substrate.

Figure 2:
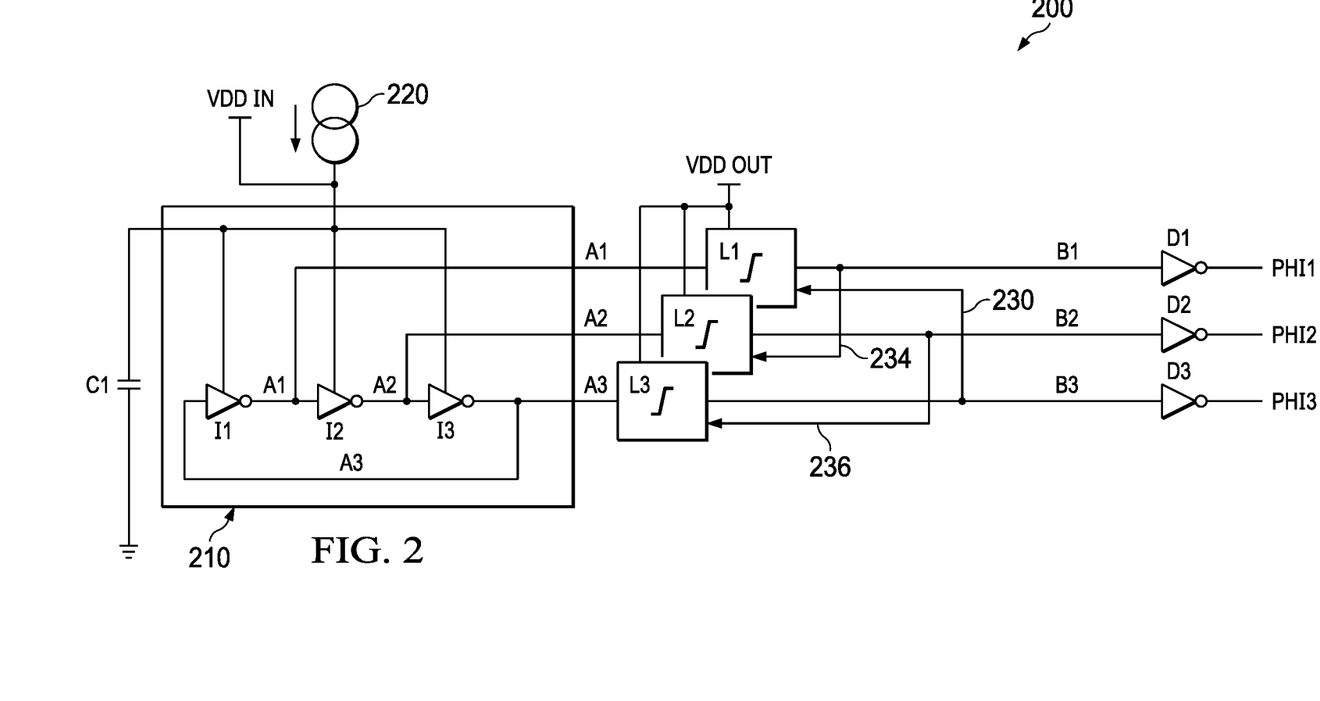
FIG. 2 illustrates an example of a ring oscillator and level shifting circuit to boost the voltage levels of the clock signals generated by the ring oscillator.

FIG. 2 illustrates a circuit 200 (which is an example of the circuit 100 of FIG. 1) to boost the voltage levels of clock signals, which are generated by a ring oscillator 210 of the circuit 200. As described above, the ring oscillator 210 has an odd number of at least three stages. In the example of FIG. 2, the ring oscillator 210 includes inverters I1, I2 and I3 to generate three ring oscillator output signals A1, A2 and A3, respectively. The inverters I1, I2, and I3 receive input supply voltage from VDD IN. The signals A1, A2 and A3 respectively drive level shifters L1, L2 and L3, which respectively generate level shifted output signals B1, B2 and B3, which in turn respectively drive output drivers D1, D2 and D3. Level shifters L1, L2, and L3 receive input supply voltage from VDD OUT which is at a higher voltage level than VDD IN. In this example, the output drivers D1, D2 and D3 are demonstrated as inverting output drivers. In other examples, output drivers D1, D2, and D3, could be implemented as non-inverting output drivers. Output drivers D1, D2 and D3 generate a three-phase clock output of PHI1, PHI2 and PHI3, respectively. The circuit 200 includes a current source 220 that is configured to provide current to pre-bias the ring oscillator 210. Also, the circuit 200 uses at least three phases for oversampling and clock recovery of downstream circuits. As shown, VDD IN is supplied to inverters I1, I2 and I3, of the ring oscillator 210 and which in some examples can also be periodically switched as shown in FIG. 5. A capacitor C1 maintains an input voltage VDD IN for short time intervals if VDD IN is off. The capacitor C1 also reduces jitter of the generated clock signal.

The level shifters L1 through L3 have high impedance controls to conserve power in the system, where output from one level shifter controls the impedance state of another level shifter. As shown in FIG. 2, the level shifters L1 through L3 are connected in a chained ring, in which: (a) output signal B3 (230) from level shifter L3 is connected to control the impedance state of L1, and to pull-up the output signal B1 to a high voltage supply rail if the output signal B3 has a low voltage state; (b) output signal B1 (234) from level shifter L1 is connected to control the impedance state of L2, and to pull-up the output signal B2 to the high voltage supply rail if the output signal B1 has the low voltage state; and (c) output signal B2 (236) from level shifter L2 is connected to control the impedance state of L3, and to pull-up the output signal B3 to the high voltage supply rail if the output signal B2 has the low voltage state.

By using three or more phases and current-controlled frequency of the ring oscillator 210, various deficiencies of previous circuits are overcome. For example, the circuit 200 does not require clock frequency trimming (such as by using trimming resistances during manufacturing) and clock recovery training sequences. Also, because multiple clock phases are generated and shifted via multiple level shifters (instead of a single level shifter of previous systems), lower clock frequencies (compared to data frequency) can be used, which further conserves power in the circuit 200.

Figure 3:
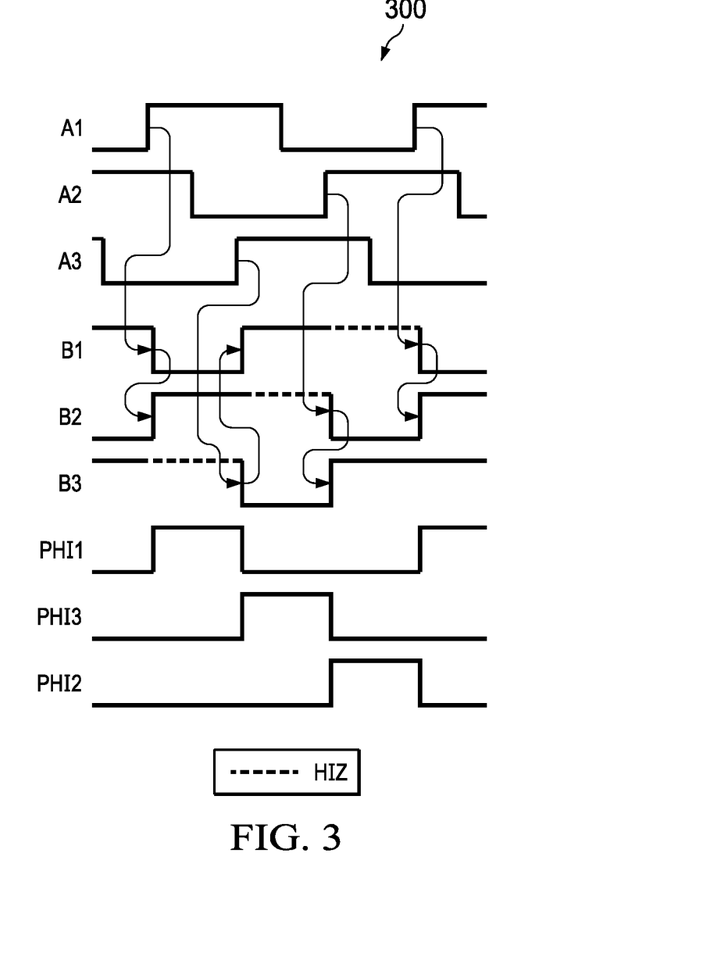
FIG. 3 is a timing diagram for the signals depicted in the circuit of FIG. 2.

FIG. 3 is a timing diagram 300 for signals in the circuit 200 of FIG. 2. Clock signals A1, A2 and A3 are generated and output by the ring oscillator 210. A rising edge on A1 triggers a falling edge on B1, which is output by level shifter L1 of FIG. 2. The falling edge of B1 triggers a rising edge of B2, which is output by level shifter L2 of FIG. 2. During this period, in response to B2 being high while A3 is low, the output B3 from level shifter L3 of FIG. 2 is held in its high impedance state, as shown by dotted lines in FIG. 3. A rising edge of A3 triggers a falling edge of B3, which in turn triggers a rising edge of B1, thereby placing B2 in high impedance state. A rising edge of A2 triggers a falling edge of B2, which in turn places B1 in high impedance state. The cycle then repeats over time during normal operation. As shown in FIG. 3, while any one of the output clock signals PHI1 PHI2 and PHI3 is high, a respective one of the level shifters operates in its high impedance state as shown by the dotted lines for each of B1, B2, and B3. Output PHI1 (described above with respect to FIG. 2) is an inverted version of B1 (PHI1=!B1). Output PHI2 is an inverted version of B2 (PHI2=!B2), and output PHI3 is an inverted version of B3 (PHI3=!B3). To provide a desired three-phase clock timing sequence for downstream circuits (not shown) where one signal of the sequence is generated before the next succeeding signal of the sequence, output PHI1 provides the first rising clock edge of the desired sequence. As shown, the next rising clock edge is provided by output PHI3 which provides the next rising edge of the desired sequence and the next rising edge of the clock timing sequence is provided by output PHI 2.

Figure 4:
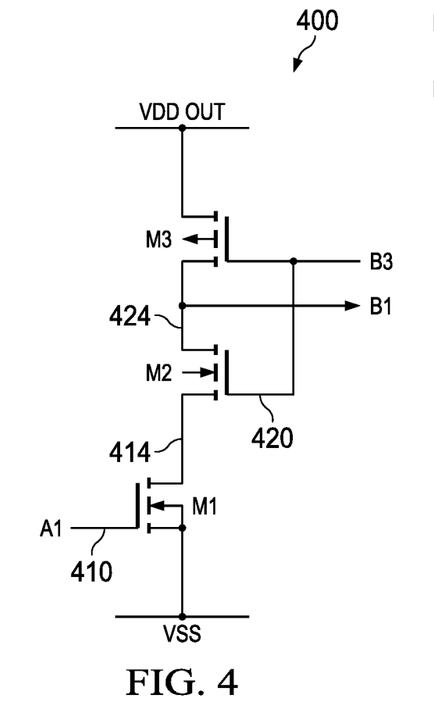
FIG. 4 illustrates an example of a level shifter circuit that receives a control signal from another level shifter circuit to control switching and impedance states of the level shifter circuit.

FIG. 4 illustrates an example of a level shifter circuit 400, which is a representative one of the level shifters L1 through LN described above with respect to FIG. 1 and L1 through L3 with respect to FIG. 2. For ease of explanation, in the following example, the level shifter circuit 400 is described as the level shifter L1, such that stage 1 (FIG. 1) or I1 (FIG. 2) of oscillator 110 (FIG. 1) or 210 (FIG. 2), respectively, provides the clock signal A1 to an input 410. Also, in this example, an input 420 is coupled to receive the signal B3 from another level shifter (e.g., L3 of FIG. 2) to control switching and impedance states of the level shifter L1. The level shifter circuit 400 includes a first transistor device M1 (n-channel field effect transistor), which is connected between a voltage reference (VSS) and a node 414. M1 includes the input 410 (gate of M1) coupled to receive the clock signal A1, and M1 provides its output at the node 414 in response to the clock signal A1. A second transistor device M2 (n-channel field effect transistor) is connected between nodes 414 and 424. A third transistor device M3 (p-channel field effect transistor) is connected between a voltage supply (VDD OUT) and the node 424. M2 and M3 are coupled at the node 424 to provide the output B1 of the level shifter L1. The input 420 (gate of M2, and gate of M3) is coupled to the output B3 of the level shifter L3 (FIG. 2).

Referring back to FIG. 2, for the level shifter L1: (a) the pull-down state for B1 (e.g., down to VSS) is activated in response to a high voltage (i.e., near VDD OUT) at A1 and B3; and (b) the pull-up state for B1 (e.g., up to VDD OUT) is activated in response to a low voltage of B3 (e.g., at or near VSS). Similarly, for the level shifter L2 (FIG. 2): (a) the pull-down state for B2 is activated in response to a high voltage at A2 and B1; and (b) the pull-up state for B2 is activated in response to a low voltage of B1. Likewise, for the level shifter L3 (FIG. 2): (a) the pull-down state for B3 is activated in response to a high voltage at both A3 and B2; and (b) the pull-up state for B3 is activated in response to a low voltage state of B2.

FIG. 5 illustrates an example circuit 500 (e.g., corresponding to the circuit 100 of FIG. 1). The circuit 500 includes a ring oscillator 510 and level shifter circuit 520 that includes level shifters L1, L2, and L3 and that receive their input voltage from VDD OUT. Similar to FIG. 2 above, outputs B1, B2, and B3 of level shifters L1, L2, and L3 can be fed to drivers D4, D5, and D6, respectively, to provide respective clock output signals PH1, PH2, and PHI3. The circuit 500 also includes a controller 524 (e.g., control circuit) configured to operate an enable signal 534 and to control oscillator startup (e.g., at power up). In this example, the ring oscillator 510 is implemented by NOR gates. In other examples, the ring oscillator 510 is implemented by other inverting logic circuitry, such as an arrangement of inverters or NAND gates. A first switch 530 controls power to the ring oscillator 510 by switching power from current source 540 when switch 530 is closed in response to the enable signal 534 from the controller 524. In an example, in response to assertion of the enable signal 534 (e.g., enable signal goes low), the ring oscillator 510 operates in an "on" state. In the on state, switch 530 is closed to supply current from the current source 540 to the stages of the ring oscillator 510.

In the normal operating mode of the ring oscillator 510, the controller 524 provides the enable signal 534 to close the switch 530 and a second switch 550. When closed, current sourced through closed switches 530 and 550 charges capacitors C13 and C14 in diode capacitor network 560 to provide VDD IN to the ring oscillator 510. When switch 530 is closed, current source 540 supplies current to each of the ring oscillator 510 and the diode capacitor network 560, which also provides VDD IN. Current source 570 is a stand-by current source that is used to provide standby current during long periods of time when the switches 530 and 550 are OFF (e.g., open switches). The diode capacitor network 560 includes diodes 562 and 564 to clamp the voltage of VDD IN to a desired operating voltage. For example, when switches 530 and 550 are open for an extended period, the current source 570 charges VDD IN to the voltage level set by the diodes 562 and 564. While two diodes are shown in the example of FIG. 5, different numbers of diodes or other clamping circuitry may be used in other examples.

As a further example, the diode capacitor network 560 supports two operating modes for the ring oscillator 510, referred to as Mode 1 and Mode 2. In some examples, the circuit 500 can be configured to support both operating modes and, in other examples, it may be configured to support only one of the operating modes. Mode 1 refers to ring oscillator 510 operations when switches 530 and 550 are switched ON for greater duration than off, providing long periods of ring oscillator ON time (e.g., where the switches are closed) with intermittent brief time periods of OFF time (e.g., where the switches are opened). In an example where MODE 1 is determined to be the sole or primary operating mode of the ring oscillator 510, then capacitor C14 and diodes 562 and 564 along with the current source 570 can be omitted from the circuit 500. Mode 2 refers to ring oscillator 510 operations where switches 530 and 550 are switched OFF for long periods of time followed by shorter periods of ON time. In MODE 2, the current source 570 maintains VDD IN by charging capacitor C14. As mentioned, the diodes 562 and 564 can clamp VDD IN to a predetermined level and from rising too high of a value when C14 is charged during periods that switches 530 and 550 are switched off. In an example where Mode 2 is determined to be the sole or primary operating mode, then capacitor C13 and switch 550 can be omitted from the circuit 500. Some applications may support both MODE 1 and MODE 2.

Figure 6:
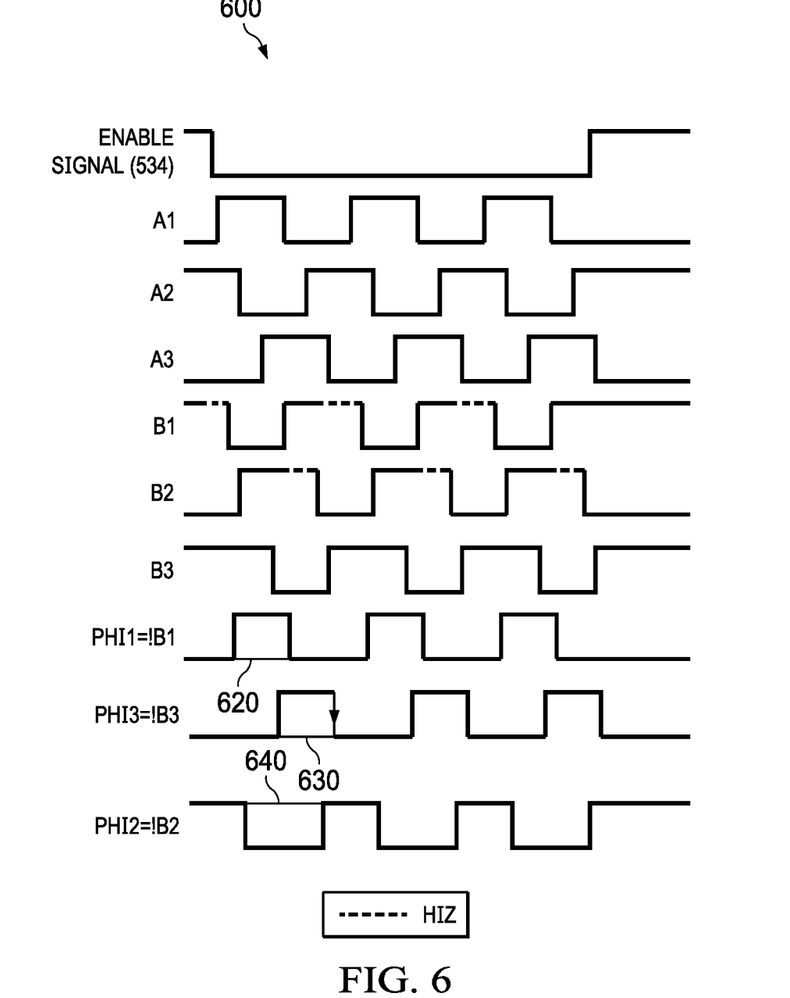
FIG. 6 is a timing diagram for the ring oscillator and level shifter depicted in FIG. 5.

FIG. 6 is a timing diagram 600 for the circuit 500 of FIG. 5. As shown in FIG. 6, signals A1 through A3 and B1 through B3 begin to transition after the enable signal (by assertion of the enable signal 534 of FIG. 5) goes low in this example. If the enable signal (by assertion of the enable signal 534) is synchronized to the rising edge of PHI3, then additional logic conditions for gating B2 with the enable signal 534 is simplified. Thus, during the synchronous condition, the B1 pull-up condition is the inversion of B3 (!B3) as described above. In examples when the enable signal (enable signal 534) is not synchronized to the rising edge of PHI3, then the B1 pull-up condition is: (a) the inversion of B3 (!B3); or (b) the inversion of B2 "ANDed" with the enable signal 534 (!B2&ENABLE). The other pull-up and pull-down conditions for B2 and B3 are the same as described above with respect to FIG. 4. In another example, a particular number of clock pulse edges of PHI1 PHI2 and/or PHI3 can be filtered (e.g., removed) shown at 620, 630 and/or 640 to ensure that the ring oscillator 510 is operating at the desired frequency before applying the level-shifted phase clocks to downstream circuits.

Figure 7:
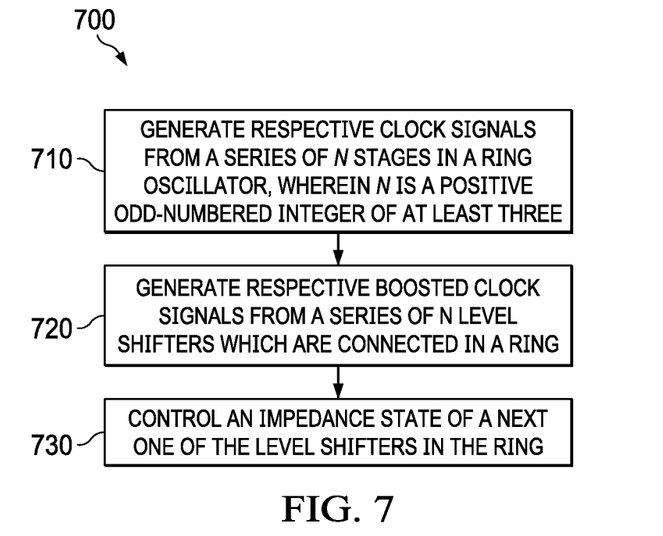
FIG. 7 illustrates an example method to generate multiphase oscillator signals that are level shifted.

FIG. 7 illustrates an example method 700 to generate multiphase oscillator signals that are level shifted. For simplicity, the method is shown and described as executing serially, but the method is not limited by the illustrated order, because parts of the method could occur in different orders and/or concurrently. At 710, the method 700 generates respective clock signals from a series of N stages in a ring oscillator (e.g., ring oscillator 110, 210, and 510) where N is a positive odd-numbered integer of at least three. At 720, in response to the clock signals, the method 700 generates respective boosted clock signals from a series of N level shifters (e.g., level shifter L1, L2, L3), which are connected in a ring. At 730, in response to the respective boosted clock signal from each level shifter, the method 700 controls an impedance state of a next one of the level shifters in the ring. Although not shown in FIG. 7, the method 700 can also supply a current to the stages of the ring oscillator, and adjust an oscillator output frequency of each stage according to the supplied current.

Figure 8:
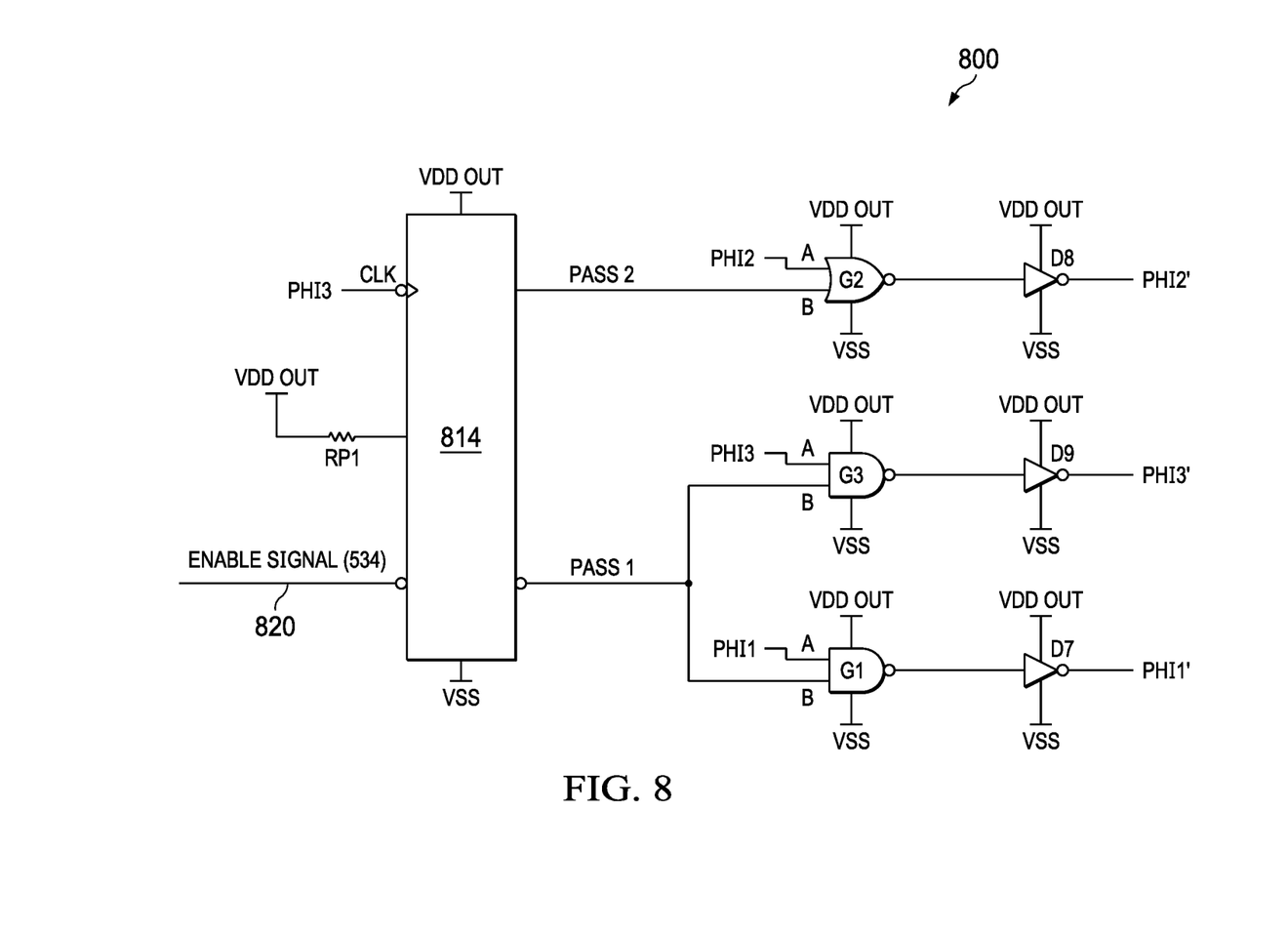
FIG. 8 illustrates an example clock filtering circuit to filter clock signals of a ring oscillator circuit and to achieve startup frequency accuracy of the oscillator.

FIG. 8 illustrates an example filtering circuit 800 to filter clock signals of a ring oscillator circuit shown in FIGS. 1, 2, and 5, where the circuit 800 is configured to achieve startup frequency accuracy of the ring oscillator circuit. NAND gate G1, NOR gate G2 and NAND gate G3 gate receive unfiltered clock signals PHI1 PHI2 and PH3 at node A of each gate and generate output to drivers D7, D8, and D9, respectively. In response to outputs from gates G1, G2, and G3, drivers D7, D8, and D9 generate filtered output clock signals PHI1', PHI2', and PHI3', respectively. The gates G1, G2 and G3 have respective node B control inputs to control filtering of clock signals by enabling or disabling the outputs of G1, G2 and G3, respectively. A flip-flop 814 has: (a) an output "PASS 1" controls passing of unfiltered clock signals PHI1 and PHI3 which are connected to the respective node A inputs of G1 and G3; and (b) an output "PASS 2" is connected to the control input node B of G2 and controls passing of unfiltered clock signal PHI2. Flip-flop 814 is clocked by unfiltered PHI3 in this example, and its respective D input is tied high to VDD OUT through pullup RP1. An input 820 receives enable signal 534 of FIG. 5 and provides a control reset for the flip-flop 814. As described above, PHI1 PHI2 and PHI3 are the unfiltered phases such as generated in the circuit examples of FIG. 1, FIG. 2, and FIG. 5, and PHI1', PHI2', and PHI3' are the respective filtered phases. The circuit 800 filters one pulse in this example, but it can be extended by adding more D Flip-Flops in series to flip-flop-814. As shown, each of the flip-flop 814, the gates G1 through G3, and drivers D7 through D9 are powered by VDD OUT with respect to common connection VSS.

In this description, the term "based on" means based at least in part on. Modifications are possible in the described embodiments, and other embodiments are possible, within the scope of the claims.

What is claimed is:

1. A circuit, comprising:
   a ring oscillator including a series of N stages in a first ring, each stage including a respective output terminal coupled to a respective input terminal of a next one of the stages in the first ring, wherein N is a positive odd-numbered integer of at least three;
   a series of N level shifters in a second ring, respectively connected to the N stages, each level shifter configured to receive a respective clock signal from the respective output terminal of the stage to which it is connected and to generate a respective boosted clock signal responsive thereto, the boosted clock signal controlling an impedance state of a next one of the level shifters in the second ring;
   a controller having a control output coupled to at least one of the stages, the controller configured to drive the control output to enable or disable the ring oscillator for a number of pulse edges of the boosted clock signals; and
   a filtering circuit configured to filter one or more of the pulse edges to achieve a particular startup frequency before the control output enables the ring oscillator.

2. The circuit of claim 1, wherein:
   the stages are coupled to an input supply voltage terminal,
   the level shifters are coupled to an output supply voltage terminal having a greater voltage than the input supply voltage terminal, and
   the level shifters are configured to receive the respective clock signals at a voltage level of the input supply voltage terminal and to generate the respective boosted clock signals at a voltage level of the output supply voltage terminal.

3. The circuit of claim 2, further comprising a current source coupled to the stages, the current source configured to supply a current to the stages.

4. The circuit of claim 3, wherein an oscillator output frequency of each stage is adjustable responsive to the supplied current from the current source.

5. The circuit of claim 2, further comprising a capacitor and diode network coupled to the input supply voltage terminal, the capacitor and diode network configured to control a startup of the ring oscillator.

6. The circuit of claim 5, further comprising a standby current source coupled to the capacitor and diode network, wherein the capacitor and diode network is configured to receive a current from the standby current source to maintain the input supply voltage terminal at or above a threshold voltage level.

7. The circuit of claim 1, wherein each stage comprises:
a respective NOR gate having an output that is the output terminal of the respective stage.

8. The circuit of claim 1, wherein the boosted clock signal controls the impedance state of the next one of the level shifters by coupling an output from another level shifter to place the next one of the level shifters in a high impedance state.

9. The circuit of claim 1, wherein:
a particular one of the level shifters includes first, second and third transistors having respective first, second and third gates;
the first transistor is coupled between a voltage reference terminal and the second transistor;
the second transistor is coupled between the first and third transistors;
the third transistor is coupled between the second transistor and an input supply voltage terminal;
at the first gate, the particular level shifter is coupled to the respective output terminal of the stage to which the particular level shifter is connected;
the particular level shifter is configured to generate its respective boosted clock signal at a connection between the second and third transistors; and
the second and third gates are configured to: receive a respective boosted clock signal from a preceding one of the level shifters in the second ring; and control the impedance state of the particular level shifter responsive thereto.

10. The circuit of claim 9, wherein the third transistor is configured to place the particular level shifter in a high impedance state responsive to the second and third gates transitioning from a first state to a second state.

11. A circuit, comprising:
a ring oscillator including a series of N stages in a first ring, each stage including a respective output terminal coupled to a respective input terminal of a next one of the stages in the first ring, wherein N is a positive odd-numbered integer of at least three;
a series of N level shifters in a second ring, respectively connected to the N stages, each level shifter configured to receive a respective clock signal from the respective output terminal of the stage to which it is connected and to generate a respective boosted clock signal responsive thereto, the boosted clock signal controlling an impedance state of a next one of the level shifters in the second ring; and
a capacitor and diode network coupled to an input supply voltage terminal, the capacitor and diode network configured to control a startup of the ring oscillator;
in which the stages are coupled to the input supply voltage terminal, the level shifters are coupled to an output supply voltage terminal having a greater voltage than the input supply voltage terminal, and the level shifters are configured to receive the respective clock signals at a voltage level of the input supply voltage terminal and to generate the respective boosted clock signals at a voltage level of the output supply voltage terminal.

12. The circuit of claim 11, further comprising a standby current source coupled to the capacitor and diode network, wherein the capacitor and diode network is configured to receive a current from the standby current source to maintain the input supply voltage terminal at or above a threshold voltage level.

13. The circuit of claim 11, further comprising a controller having a control output coupled to at least one of the stages, the controller configured to drive the control output to enable or disable the ring oscillator for a number of pulse edges of the boosted clock signals.

14. The circuit of claim 13, further comprising a filtering circuit configured to filter one or more of the pulse edges to achieve a particular startup frequency before the control output enables the ring oscillator.

15. A circuit, comprising:
a ring oscillator including a series of stages; and
first and second level shifters, the first level shifter including first, second and third transistors having respective first, second and third gates, wherein:
the first transistor is coupled between a voltage reference terminal and the second transistor;
the second transistor is coupled between the first and third transistors;
the third transistor is coupled between the second transistor and an input supply voltage terminal;
at the first gate, the first level shifter is coupled to a stage output of one of the stages of the ring oscillator;
the first level shifter is configured to generate a first boosted output at a connection between the second and third transistors, responsive to: the stage outputs; and a second boosted output from the second level shifter;
the second and third gates are coupled to the second boosted output and configured to control an impedance state of the first level shifter responsive thereto;
the stages are coupled to the input supply voltage terminal;
the first level shifter is coupled to an output supply voltage terminal having a greater voltage than the input supply voltage terminal; and
the stage output has a voltage level of the input supply voltage terminal, and the first boosted output has a voltage level of the output supply voltage terminal.

16. The circuit of claim 15, further comprising a current source coupled to the stages, the current source configured to supply a current to the stages, wherein an oscillator output frequency of each stage is adjustable responsive to the supplied current from the current source.

17. The circuit of claim 15, further comprising a capacitor and diode network coupled to the input supply voltage terminal, the capacitor and diode network configured to control a startup of the ring oscillator.

18. The circuit of claim 17, further comprising a standby current source coupled to the capacitor and diode network, wherein the capacitor and diode network is configured to receive a current from the standby current source to maintain the input supply voltage terminal at or above a threshold voltage level.

19. The circuit of claim 15, further comprising a controller having a control output coupled to at least one of the stages, the controller configured to drive the control output to enable or disable the ring oscillator for a number of pulse edges of the boosted signals.

* * * * *